US011538837B2

(12) United States Patent
Takahashi et al.

(10) Patent No.: US 11,538,837 B2
(45) Date of Patent: Dec. 27, 2022

(54) SEMICONDUCTOR IMAGING DEVICE HAVING IMPROVED DARK CURRENT PERFORMANCE

(71) Applicant: Taiwan Semiconductor Manufacturing Co., Ltd., Hsinchu (TW)

(72) Inventors: Seiji Takahashi, Hsinchu (TW); Chen-Jong Wang, Hsin-Chu (TW); Dun-Nian Yaung, Taipei (TW); Feng-Chi Hung, Chu-Bei (TW); Feng-Jia Shiu, Jhudong Township (TW); Jen-Cheng Liu, Hsin-Chu (TW); Jhy-Jyi Sze, Hsin-Chu (TW); Chun-Wei Chang, Tainan (TW); Wei-Cheng Hsu, Kaohsiung (TW); Wei Chuang Wu, Tainan (TW); Yimin Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/308,332

(22) Filed: May 5, 2021

(65) Prior Publication Data

US 2021/0280620 A1 Sep. 9, 2021

Related U.S. Application Data

(63) Continuation of application No. 17/022,456, filed on Sep. 16, 2020, now Pat. No. 11,004,880, which is a (Continued)

(51) Int. Cl.
*H01L 27/146* (2006.01)

(52) U.S. Cl.
CPC .... *H01L 27/14603* (2013.01); *H01L 27/1463* (2013.01); *H01L 27/1464* (2013.01);
(Continued)

(58) Field of Classification Search
CPC ......... H01L 27/14603; H01L 27/14612; H01L 27/1463; H01L 27/1464; H01L 27/14641;
(Continued)

(56) References Cited

U.S. PATENT DOCUMENTS 8,570,412 B2 * 10/2013 Yanagita .............. H04N 5/3591
348/308
9,165,959 B2 * 10/2015 Chen ................. H01L 27/14612
(Continued)

OTHER PUBLICATIONS

Non-Final Office Action dated Feb. 20, 2020 for U.S. Appl. No. 16/113,101.
(Continued)

*Primary Examiner* — Earl N Taylor
(74) *Attorney, Agent, or Firm* — Eschweiler & Potashnik, LLC

(57) ABSTRACT

In some embodiments, a pixel sensor is provided. The pixel sensor includes a first photodetector arranged in a semiconductor substrate. A second photodetector is arranged in the semiconductor substrate, where a first substantially straight line axis intersects a center point of the first photodetector and a center point of the second photodetector. A floating diffusion node is arranged in the semiconductor substrate at a point that is a substantially equal distance from the first photodetector and the second photodetector. A pick-up well contact region is arranged in the semiconductor substrate, where a second substantially straight line axis that is substantially perpendicular to the first substantially straight line axis intersects a center point of the floating diffusion node and a center point of the pick-up well contact region.

20 Claims, 12 Drawing Sheets

Related U.S. Application Data continuation of application No. 16/113,101, filed on Aug. 27, 2018, now Pat. No. 10,797,091.

(60) Provisional application No. 62/678,871, filed on May 31, 2018.

(52) U.S. Cl.
CPC .. *H01L 27/14612* (2013.01); *H01L 27/14641* (2013.01); *H01L 27/14689* (2013.01)

(58) Field of Classification Search
CPC ......... H01L 27/14689; H01L 27/14627; H01L 27/14605; H01L 27/14645; H01L 27/14683; H01L 27/14643
See application file for complete search history.

(56) References Cited

U.S. PATENT DOCUMENTS

| | | | | |
|---|---|---|---|---|
| 9,525,835 | B2* | 12/2016 | Funatsu | H04N 5/3559 |
| 9,712,765 | B2* | 7/2017 | Funatsu | H04N 5/374 |
| 10,074,678 | B2* | 9/2018 | Kato | H01L 27/14612 |
| 10,084,007 | B2* | 9/2018 | Lee | H01L 27/14641 |
| 10,218,927 | B2* | 2/2019 | Kwag | H04N 5/365 |
| 10,432,831 | B2* | 10/2019 | Lee | H04N 5/2254 |
| 2010/0118170 | A1* | 5/2010 | Matsumoto | H01L 27/14689 257/292 |
| 2012/0248293 | A1 | 10/2012 | Yamazaki et al. | |
| 2013/0308008 | A1* | 11/2013 | Funatsu | H01L 27/14656 348/222.1 |
| 2014/0055653 | A1* | 2/2014 | Nishihara | H04N 5/3559 348/300 |
| 2014/0211058 | A1* | 7/2014 | Nishihara | H01L 27/14603 348/308 |
| 2014/0293107 | A1* | 10/2014 | Nishihara | H04N 5/379 348/308 |
| 2015/0214266 | A1* | 7/2015 | Kao | H01L 27/14616 257/292 |
| 2016/0071893 | A1* | 3/2016 | Shinohara | H01L 27/14627 257/432 |
| 2016/0086984 | A1* | 3/2016 | Wang | H01L 27/14689 257/292 |
| 2016/0322407 | A1* | 11/2016 | Yaung | H01L 27/14605 |
| 2017/0117309 | A1 | 4/2017 | Chen et al. | |
| 2017/0200761 | A1* | 7/2017 | Lee | H01L 27/1463 |
| 2018/0102392 | A1* | 4/2018 | Hwang | H01L 27/14605 |
| 2018/0240826 | A1* | 8/2018 | Park | H01L 27/14603 |
| 2018/0255215 | A1* | 9/2018 | Lee | H04N 5/2254 |
| 2018/0301509 | A1* | 10/2018 | Ishii | H04N 5/3597 |
| 2019/0027524 | A1* | 1/2019 | Sato | H01L 27/14603 |
| 2019/0027526 | A1* | 1/2019 | Lee | H01L 27/14636 |
| 2019/0237496 | A1* | 8/2019 | Kwag | H04N 5/37457 |
| 2019/0371838 | A1* | 12/2019 | Takahashi | H01L 27/14603 |
| 2021/0280620 | A1* | 9/2021 | Takahashi | H01L 27/14603 |

OTHER PUBLICATIONS

Notice of Allowance dated Jun. 2, 2020 for U.S. Appl. No. 16/113,101.
Notice of Allowance dated Jan. 13, 2021 for U.S. Appl. No. 17/022,456.

* cited by examiner

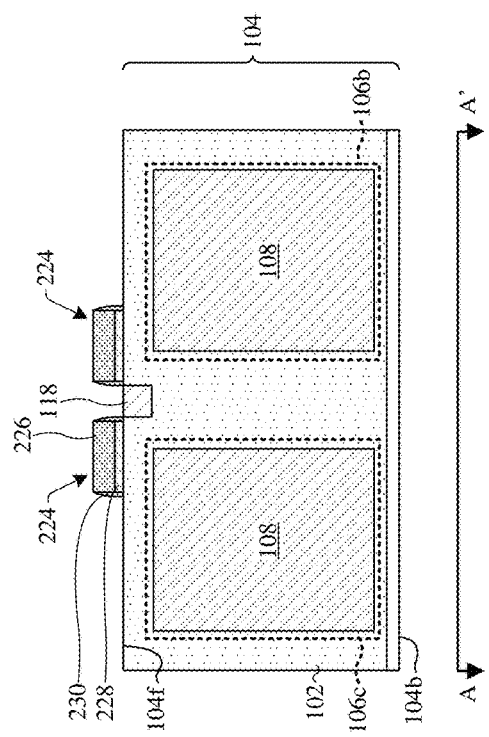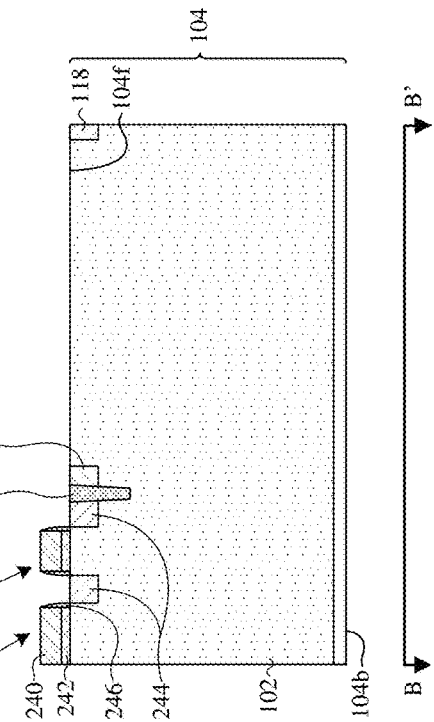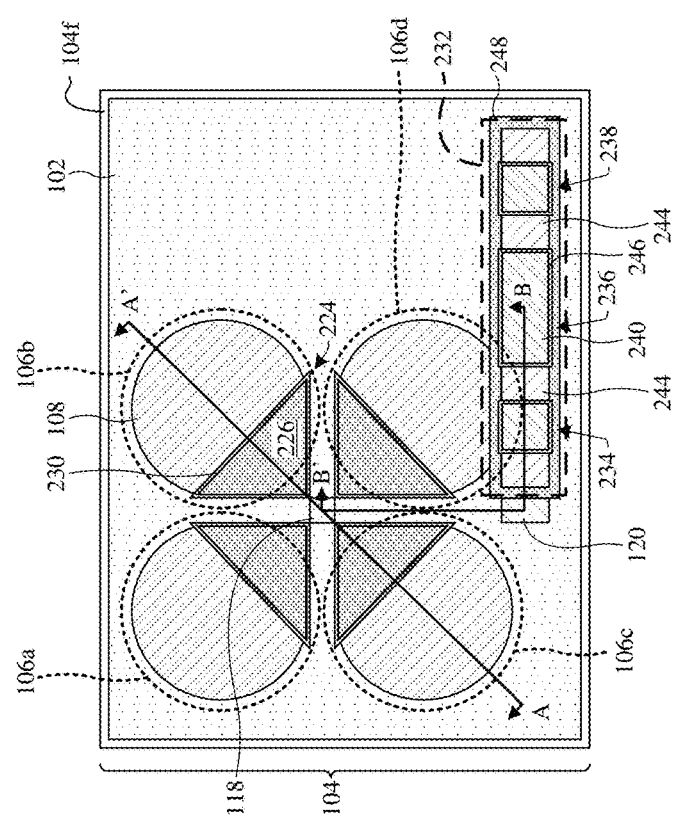
Fig. 7B
Fig. 7C
Fig. 7A

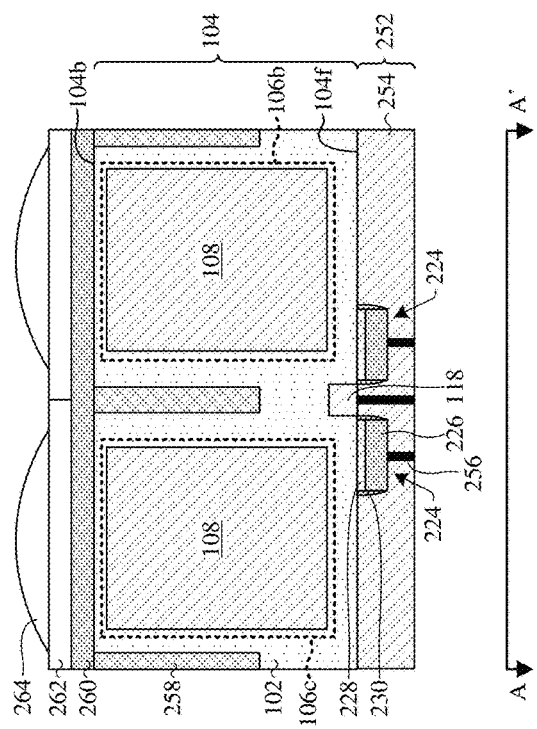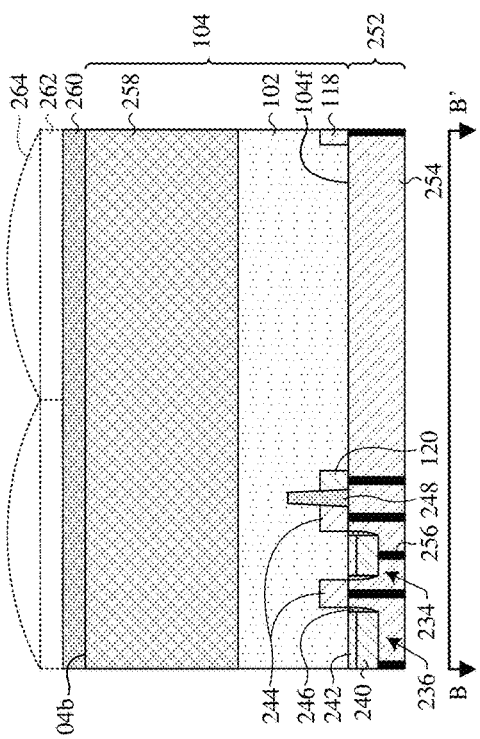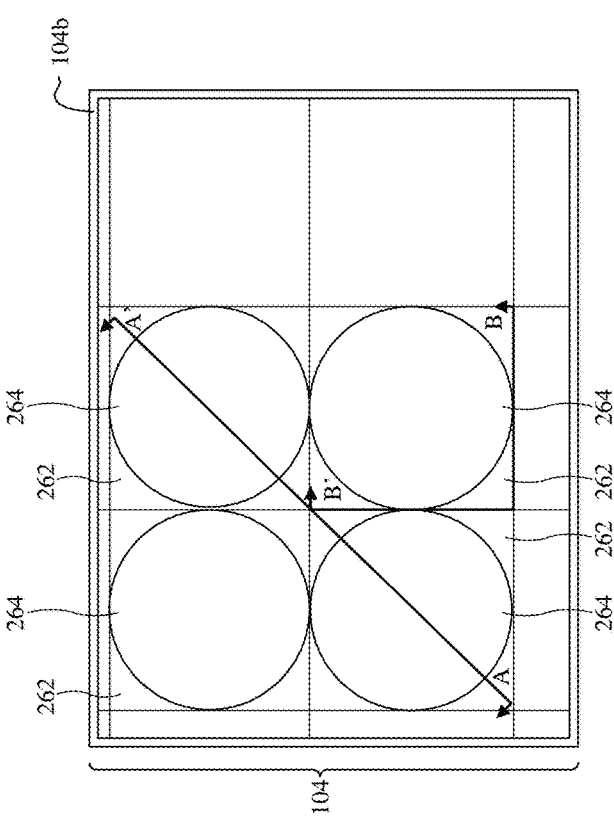

SEMICONDUCTOR IMAGING DEVICE HAVING IMPROVED DARK CURRENT PERFORMANCE

REFERENCE TO RELATED APPLICATIONS

This Application is a Continuation of U.S. application Ser. No. 17/022,456, filed on Sep. 16, 2020, which is a Continuation of U.S. application Ser. No. 16/113,101, filed on Aug. 27, 2018 (now U.S. Pat. No. 10,797,091, issued on Oct. 6, 2020), which claims the benefit of U.S. Provisional Application No. 62/678,871, filed on May 31, 2018. The contents of the above referenced Patent Applications are hereby incorporated by reference in their entirety.

BACKGROUND

Many modern day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors. Compared to CCD pixel sensors, CMOS pixel sensors are favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4C through 10A-10C illustrate a series of various views of some embodiments of a method for forming the integrated chip (IC) of FIGS. 2A-2C.

DETAILED DESCRIPTION

Figure 1:
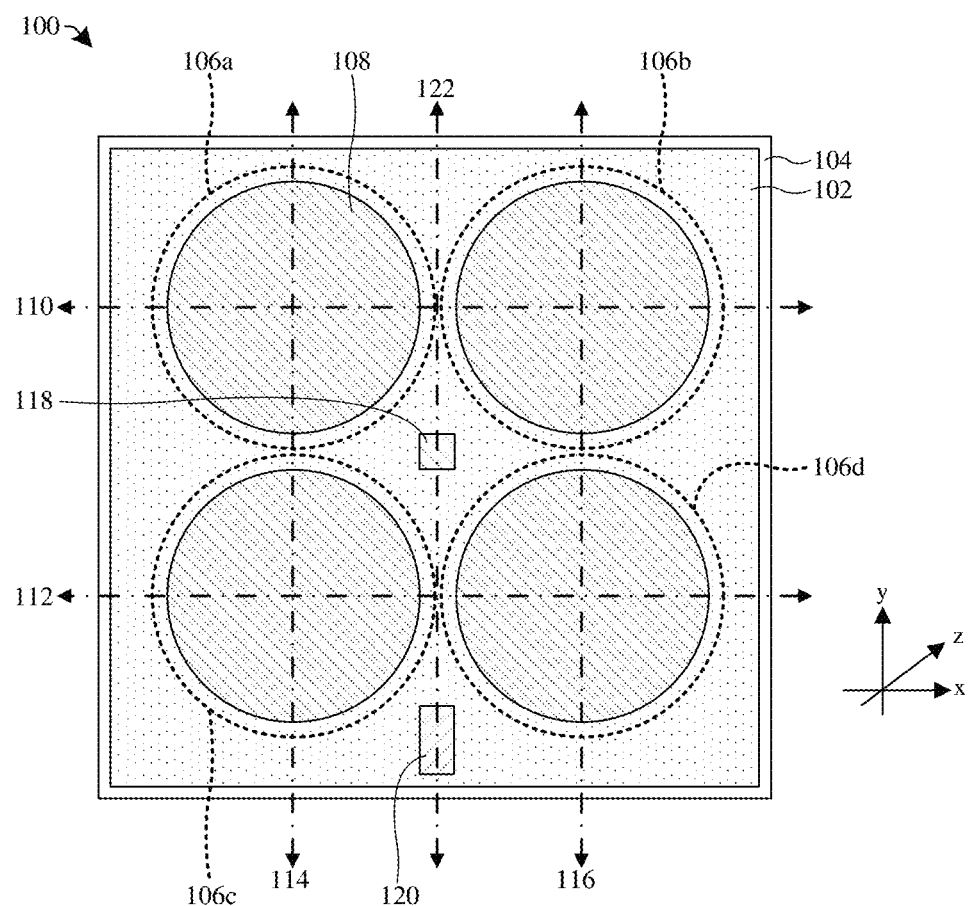
FIG. 1 illustrates a layout view of some embodiments of a pixel sensor having a pick-up well contact region and floating diffusion node positioned to reduce dark current and dark current imbalances.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide semiconductor image sensors (CISs) have an array of pixel sensors. A pixel sensor records incident radiation using a photodetector, and facilitates digital readout of the recording with a plurality of pixel devices (e.g., a transfer transistor, a reset transistor, a source follower transistor, and/or a row-select transistor). Some pixel sensors comprise an array of photodetectors (e.g., a 2×2 photodetector pixel sensor). In such pixel sensors, a plurality of photodetector collector regions are disposed in a pixel sensor well region. Further, the photodetectors share a common floating diffusion node (e.g., a region of the semiconductor substrate in which the photodetectors may respectively transfer accumulated charge during readout), common pixel devices (e.g., a reset transistor, a source follower transistor, and/or a row-select transistor), and a pick-up well contact region. The pick-up well contact region provides a region of low resistance between a conductive contact and the pixel sensor well region. During operation, a bias voltage is applied to the pixel sensor well region via the conductive contact, such that the photodetectors are reverse-biased.

One challenge with the above pixel sensors is dark current. Dark current is electrical current that passes through the photodetectors even when no photons are entering the photodetector. One dark current source is due to the location (and/or proximity) of the pick-up well contact region in relation to the photodetectors and the floating diffusion node. For example, in a 2×2 photodetector pixel sensor, one of the photodetectors is typically disposed directly between the floating diffusion node and the pick-up well contact region, such that a substantially straight line axis that intersects a center point of the floating diffusion node and the pick-up well contact region also intersects the collector region of the one of the photodetectors. Because the photodetector is arranged between the floating diffusion node and the pick-up well contact region, dark current from the pick-up well contact region increases within the photodetector, thereby causing the photodetector to suffer from poor dark current performance. Furthermore, in such a layout the pick-up well contact region is arranged at different distances from the photodetectors. The different distances cause the dark current from the pick-up well contact region to affect the different photodetectors differently, resulting in large dark current imbalances between the different photodetectors (e.g., differences in dark current between the individual photodetectors of the sensor).

The present application is directed toward a pixel sensor having a plurality of photodetectors. The pixel sensor has a pick-up well contact region that is arranged at a position that is a substantially equal distance from the plurality of photodetectors and that is separated from a floating diffusion node by a path extending between adjacent ones of the plurality of photodetectors. By having the pick-up well contact region arranged at a substantially equal distance from the plurality of photodetectors, large dark current imbalances can be reduced. Furthermore, because the pick-up well contact region is separated from a floating diffusion node by a path extending between adjacent ones of the plurality of photodetectors, the floating diffusion node can drain the dark current generated by the pick-up well contact region before the dark current interacts with the plurality of photodiodes. Accordingly, the pixel sensor of the present disclosure may have improved dark current performance.

In various embodiments, the pixel sensor may have a first photodetector and a second photodetector disposed in a semiconductor substrate, where a first substantially straight line axis intersects a center point of the first photodetector and a center point of the second photodetector. A floating diffusion node is disposed in the semiconductor substrate between the first photodetector and the second photodetector. Further, a pick-up well contact region is disposed in the semiconductor substrate, where a second substantially straight line axis that is substantially perpendicular to the first substantially straight line axis intersects a center point of the floating diffusion node and a center point of the pick-up well contact region. Because the floating diffusion node is disposed between the first photodetector and the second photodetector and because the second substantially straight line axis is substantially perpendicular to the first substantially straight line axis, the pick-up well contact region is spaced about equidistant from the first photodetector and the second photodetector, thereby reducing dark current imbalances in the pixel sensor. Further, because the center points of the pick-up well contact region and the floating diffusion node are arranged along a substantially straight line axis that is between the first photodetector and the second photodetector, the floating diffusion node may drain more of the dark current generated by the pick-up well contact region, thereby preventing the dark current from interacting with the photodetectors and reducing overall dark current of the pixel sensor. Put differently, as the substantially straight line axis between center points of the pick-up well contact region and the floating diffusion node does not extend across the first and second photodetectors, dark current between the pick-up well contact region and the floating diffusion node is less likely to interact with the first and second photodetectors. For example, the dark current may be reduced by between approximately 20% and approximately 50% (e.g., from approximately 4.2 electrons/pixel/second (e/p/s) to approximately 3.0 e/p/s).

FIG. 1 illustrates a layout view of some embodiments of a pixel sensor 100 having a pick-up well contact region and floating diffusion node positioned to reduce dark current and dark current imbalances.

As shown in FIG. 1, the pixel sensor 100 comprises a pixel sensor well region 102 disposed in a semiconductor substrate 104. In some embodiments, the semiconductor substrate 104 comprises any type of semiconductor body (e.g., monocrystalline silicon/CMOS bulk, silicon-germanium (SiGe), silicon on insulator (SOI), etc.). The pixel sensor well region 102 is a region of the semiconductor substrate 104 having a first doping type (e.g., p-type doping).

A plurality of photodetectors 106a-d are disposed in the semiconductor substrate 104. In some embodiments, the photodetectors 106a-d are arranged in an array comprising a plurality of rows (e.g., along an x-axis) and columns (e.g., along a y-axis). The photodetectors 106a-d are configured to absorb incident radiation (e.g., photons) and generate respective electrical signals corresponding to the incident radiation. In some embodiments, each of the photodetectors 106a-d comprise a photodetector collector region 108 disposed in the pixel sensor well region 102. In further embodiments, the photodetector collector regions 108 are discrete regions of the semiconductor substrate 104 having a second doping type (e.g., n-type doping) opposite the first doping type. In yet further embodiments, the photodetectors 106a-d each comprise a photodetector collector region 108 and portions of the pixel sensor well region 102 disposed around the photodetector collector region 108 in which a depletion region has formed (e.g., due to p-n junctions between the photodetector collector regions 108 and the pixel sensor well region 102).

In some embodiments, the plurality of photodetectors 106a-d comprise a first photodetector 106a, a second photodetector 106b, a third photodetector 106c, and a fourth photodetector 106d. In some embodiments, a first substantially straight line axis 110 extends in a first direction (e.g., along the x-axis) and intersects a center point of the first photodetector 106a and a center point of the second photodetector 106b. In further embodiments, a second substantially straight line axis 112 that is parallel to the first substantially straight line axis 110 intersects a center point of the third photodetector 106c and a center point of the fourth photodetector 106d. In further embodiments, a third substantially straight line axis 114 extends in a second direction (e.g., along the y-axis) substantially perpendicular to the first direction and intersects the center point of the first photodetector 106a and the center point of the third photodetector 106c. In yet further embodiments, a fourth substantially straight line axis 116 that is parallel to the third substantially straight line axis 114 intersects the center point of the second photodetector 106b and a center point of the fourth photodetector 106d.

A floating diffusion node 118 is disposed in the pixel sensor well region 102. The floating diffusion node 118 is a region of the semiconductor substrate 104 having the second doping type (e.g., n-type doping). In some embodiments, the floating diffusion node 118 is disposed between the first photodetector 106a, second photodetector 106b, third photodetector 106c, and fourth photodetector 106d. In some embodiments, the floating diffusion node 118 is disposed at a substantially equal distance from the first photodetector 106a, second photodetector 106b, third photodetector 106c, and fourth photodetector 106d. In further embodiments, the center point of the floating diffusion node is spaced about a same distance from the first substantially straight line axis 110 as the second substantially straight line axis 112. In further embodiments, the center point of the floating diffusion node is spaced about a same distance from the third substantially straight line axis 114 as the fourth substantially straight line axis 116. In yet further embodiments, a center point of the floating diffusion node 118 is spaced about equidistant from the center points of the photodetectors 106a-d.

A pick-up well contact region 120 is disposed in the pixel sensor well region 102. The pick-up well contact region 120 is configured to provide a low resistance region between the pixel sensor well region 102 and a conductive contact (not shown). The pick-up well contact region 120 is a region of the semiconductor substrate 104 having the first doping type (e.g., p-type doping). In some embodiments, the pick-up well contact region 120 has a higher concentration of the first doping type than the pixel sensor well region 102.

A fifth substantially straight line axis 122 extends in the second direction and intersects the center point of the floating diffusion node 118 and a center point of the pick-up well contact region 120. In some embodiments, the floating diffusion node 118 is disposed on a first side of the second substantially straight line axis 112 between the third substantially straight line axis 114 and the fourth substantially straight line axis 116. In further embodiments, the pick-up well contact region 120 is disposed between the third substantially straight line axis 114 and the fourth substantially straight line axis 116 on a second side of the second substantially straight line axis 112 opposite the first side. In yet further embodiments, the fifth substantially straight line axis 122 extends in the second direction between the photodetector collector region 108 of the first photodetector 106a and the photodetector collector region 108 of the second photodetector 106b.

In some embodiments, the fifth substantially straight line axis 122 is substantially perpendicular to the first substantially straight line axis 110 and/or the second substantially straight line axis 112. In further embodiments, the fifth substantially straight line axis 122 is substantially parallel to the third substantially straight line axis 114 and/or the fourth substantially straight line axis 116. In further embodiments, the fifth substantially straight line axis 122 intersects the first substantially straight line axis 110 at a mid-point between the center point of the first photodetector 106a and the center point of the second photodetector 106b. In further, the fifth substantially straight line axis 122 intersects the second substantially straight line axis 112 at a mid-point between the center point of the third photodetector 106c and the center point of the fourth photodetector 106d. In yet further embodiments, the center point of the pick-up well contact region 120 is spaced about equidistant from the center point of the third photodetector 106c and the center point of the fourth photodetector 106d.

Because the pick-up well contact region 120 is spaced about equidistant from the third photodetector 106c and the fourth photodetector 106d, dark current imbalances between the third photodetector 106c and the fourth photodetector 106d may be reduced. Further, because the fifth substantially straight line axis 122 extends in the second direction between the photodetector collector region 108 of the third photodetector 106c and the photodetector collector region 108 of the fourth photodetector 106d, the floating diffusion node 118 may drain more of the dark current generated by the pick-up well contact region 120. Because the floating diffusion node 118 may drain more of the dark current generated by the pick-up well contact region 120, overall dark current of the pixel sensor 100 may be reduced. That is, because the fifth substantially straight line axis 122 does not cross into the photodetector collector regions 108 of the third and fourth photodetectors 106c and 106d, the third and fourth photodetectors 106c and 106d are not in the path along which the dark current passes. Accordingly, dark current performance of the pixel sensor 100 may be improved.

Figure 2A:
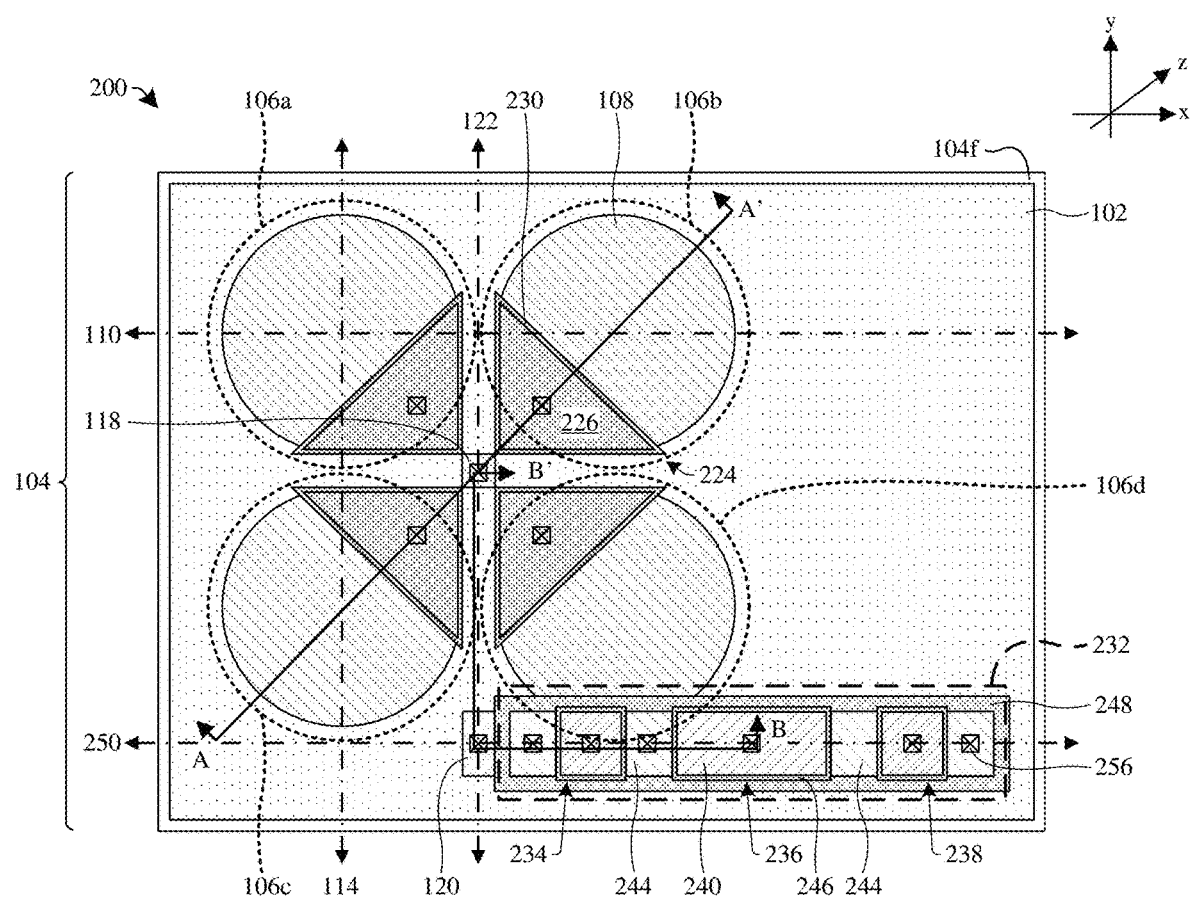
FIGS. 2A-2C illustrate various views of an integrated chip (IC) comprising the pixel sensor of FIG. 1.
Figure 2B:
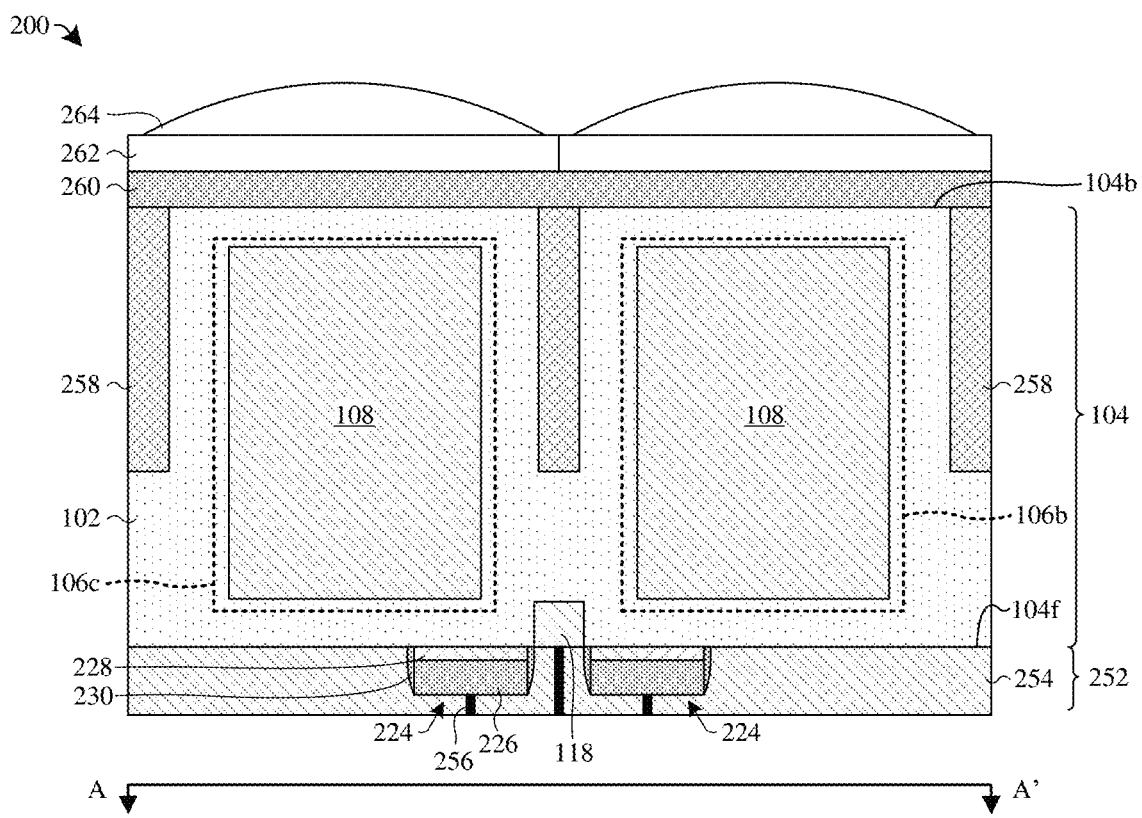
Figure 2C:
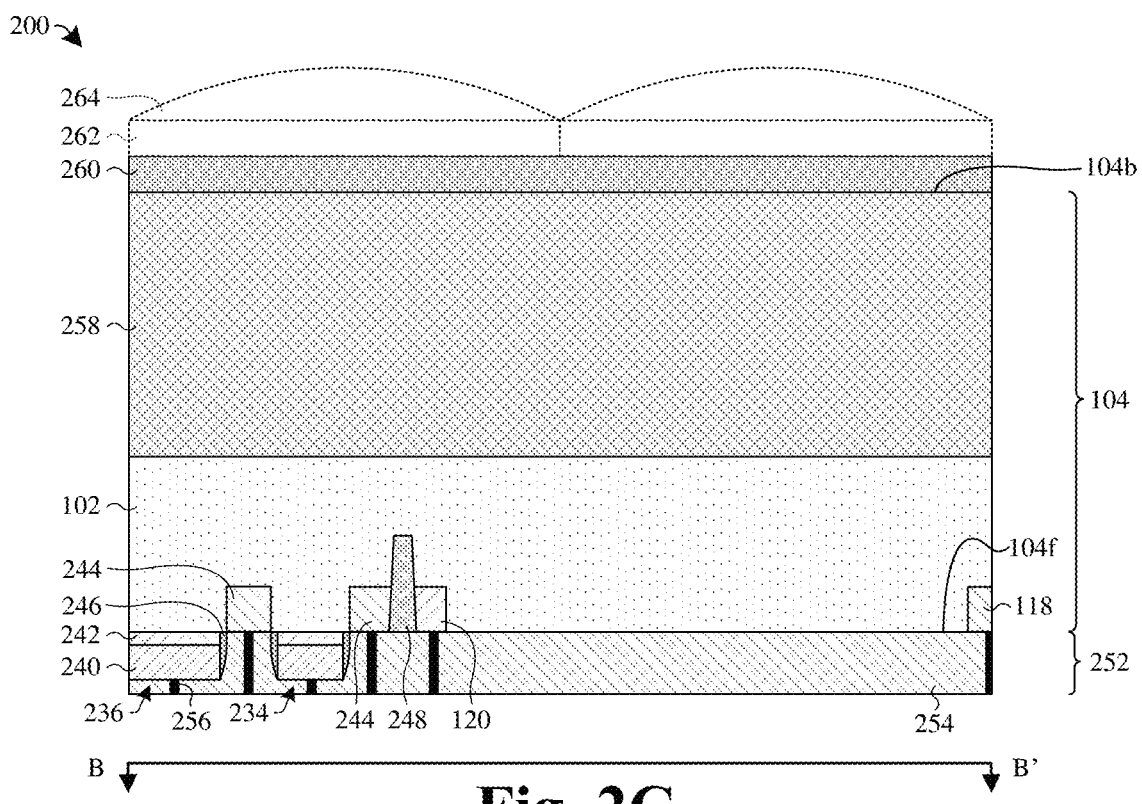

FIGS. 2A-2C illustrates various views of an integrated chip (IC) 200 comprising the pixel sensor 100 of FIG. 1. FIG. 2A illustrates a view of the IC 200 facing a front-side 104f of a semiconductor substrate 104. FIG. 2B illustrates a cross-sectional view taken along line A-A' of FIG. 2A. FIG. 2C illustrates a cross-sectional view taken along line B-B' of FIG. 2A.

As shown in FIGS. 2A-2C, a plurality of transfer transistors 224 are disposed on a front-side 104f of the semiconductor substrate 104. In some embodiments, the transfer transistors 224 are respectively disposed between the floating diffusion node 118 and the center points of the photodetectors 106a-d. The transfer transistors 224 may selectively form a conductive channel between the photodetectors 106a-d and the floating diffusion node 118 to transfer accumulated charge (e.g., via absorbing incident radiation) in the photodetectors 106a-d to the floating diffusion node 118.

In some embodiments, the transfer transistors 224 each comprise a transfer transistor gate electrode 226 disposed on a transfer transistor gate dielectric 228, such that the transfer transistor gate dielectric 228 separates the transfer transistor gate electrode 226 from the front-side 104f of the semiconductor substrate 104. In some embodiments, the transfer transistor gate electrodes 226 and the transfer transistor gate dielectrics 228 may have a triangular layout when viewing the front-side 104f of the semiconductor substrate 104.

In some embodiments, the transfer transistor gate electrodes 226 may comprise, for example, doped polysilicon, fully-silicided polysilicon, a metal (e.g., aluminum), or the like. In further embodiments, the transfer transistor gate dielectrics 228 may comprise, for example, an oxide (e.g., $SiO_2$), a nitride (e.g., silicon nitride), a high-k dielectric (e.g., hafnium oxide), or the like. In further embodiments, transfer transistor sidewall spacers 230 are disposed along sidewalls of the transfer transistor gate electrodes 226 and the transfer transistor gate dielectrics 228. In yet further embodiments, the transfer transistor sidewall spacers 230 may comprise, for example, an oxide, a nitride, a carbide, or the like.

Also shown in FIGS. 2A-2C, the IC 200 comprises a pixel device region 232. In some embodiments, the pixel device region 232 comprises a reset transistor 234, a source follower transistor 236, and/or a row-select transistor 238. In further embodiments, the reset transistor 234, the source follower transistor 236, and the row-select transistor 238 each comprise a pixel device gate electrode 240 stacked on a pixel device gate dielectric 242. In further embodiments, the pixel device gate electrodes 240 may comprise, for example, doped polysilicon, fully-silicided polysilicon, a metal (e.g., aluminum), or the like. In yet further embodiments, the pixel device gate dielectrics 242 may comprise, for example, an oxide, a nitride, a high-k dielectric, or the like.

The reset transistor 234, the source follower transistor 236, and the row-select transistor 238 each comprise source/drain regions 244 disposed on opposite sides of respective pixel device gate electrodes 240. In some embodiments, the source/drain regions 244 are regions of the semiconductor substrate 104 having the second doping type (e.g., n-type doping). In further embodiments, one of the source/drain regions 244 is a common source/drain region 244 shared by the reset transistor 234 and the source follower transistor 236. In further embodiments, another one of the source/drain regions 244 is a common source/drain region 244 shared by the row-select transistor 238 and the source follower transistor 236. In further embodiments, pixel device sidewall spacers 246 are respectively disposed along sidewalls of the pixel device gate electrodes 240 and the pixel device gate dielectrics 242. In yet further embodiments, the pixel device sidewall spacers 246 may comprise, for example, an oxide, a nitride, a carbide, or the like.

A pixel device region isolation structure 248 is disposed in the semiconductor substrate 104 and around sides of the reset transistor 234, the source follower transistor 236, and the row-select transistor 238. The pixel device region isolation structure 248 is configured to provide electrical isolation between the photodetectors 106a-d and the pixel device region 232. In some embodiments, the pixel device region isolation structure 248 may contact the source/drain regions 244 of the reset transistor 234, the source follower transistor 236, and the row-select transistor 238. In other embodiments, the pixel device region isolation structure 248 may be separated by non-zero distances from the source/drain regions 244 of the reset transistor 234, the source follower transistor 236, and the row-select transistor 238. In further embodiments, the pixel device region isolation structure 248 may be, for example, a shallow trench isolation (STI) structure, a deep trench isolation (DTI) structure, or the like. In other embodiments, the pixel device region isolation structure 248 may be an isolation well comprising regions of the semiconductor substrate 104 having the first doping type (e.g., p-type doping). In such an embodiment, an isolation voltage may be applied to the isolation well to provide electrical isolation between the photodetectors 106a-d and the pixel device region 232.

In some embodiments, the pixel device gate electrodes 240, the pixel device gate dielectrics 242, and/or the pixel device sidewall spacers 246 may extend in the second direction (e.g., along the y-axis) beyond inner sidewalls of the pixel device region isolation structure 248. In further embodiments, outer sidewalls of the pixel device region isolation structure 248 define outer sides of the pixel device region 232. In further embodiments, the pick-up well contact region 120 is disposed outside of the pixel device region 232. In yet further embodiments, the pick-up well contact region 120 contacts the pixel device region isolation structure 248. In other embodiments, the pick-up well contact region 120 may be separated from the pixel device isolation structure 248 by a non-zero distance.

In some embodiments, a sixth substantially straight line axis 250 extends in the first direction and intersects the center point of the pick-up well contact region 120, center points of the source/drain regions 244, and center points of the pixel device gate electrodes 240. The sixth substantially straight line axis 250 may be substantially perpendicular to the fifth substantially straight line axis 122 and substantially parallel to the first substantially straight line axis 110. In some embodiments, the pixel device region isolation structure 248 may extend in the first direction along the sixth substantially straight line axis 250, such that outer sidewalls of the pixel device region isolation structure 248 that extend in the first direction are substantially parallel to the sixth substantially straight line axis 250.

An interconnect structure 252 comprising an interlayer dielectric (ILD) layer 254 and a plurality of conductive contacts 256 is disposed on the front-side 104f of the semiconductor substrate 104. The ILD layer 254 is disposed on front-side 104f of the semiconductor substrate 104 and may contact the pixel sensor well region 102, the floating diffusion node 118, the transfer transistors 224, the pick-up well contact region 120, the pixel device region isolation structure 248, the reset transistor 234, the source follower transistor 236, and the row-select transistor 238. In further embodiments, the ILD layer 254 may comprise one or more of a low-k dielectric layer (e.g., a dielectric with a dielectric constant less than about 3.9), an ultra-low-k dielectric layer, or an oxide (e.g., silicon oxide). Further, the conductive contacts 256 are disposed in the ILD layer 254. In further embodiments, the conductive contacts 256 may comprise, for example, tungsten, copper, or the like.

In some embodiments, the conductive contacts 256 extend through the ILD layer 254 to contact the transfer transistor gate electrodes 226, the floating diffusion node 118, the pick-up well contact region 120, the source/drain regions 244, and the pixel device gate electrodes 240. In further embodiments, a conductive contact 256 may not extend through the ILD layer 254 to contact the common source/drain region 244 shared by the source follower transistor 236 and the row-select transistor 238. In further embodiments, the sixth substantially straight line axis 250 intersects the conductive contacts 256 that contact the pick-up well contact region 120, the source/drain regions 244, and the pixel device gate electrodes 240. In further embodiments, the fifth substantially straight line axis 122 intersects the conductive contacts 256 that contact the pick-up well contact region 120 and the floating diffusion node 118.

In some embodiments, a plurality of back-side isolation (BSI) structures 258 are disposed in the semiconductor substrate 104. The BSI structures 258 extend into the semiconductor substrate 104 from a back-side 104b of the semiconductor substrate 104. The BSI structures 258 may be respectively disposed between the photodetectors 106a-d. In some embodiments, one of the BSI structures 258 may extend in the second direction over both the floating diffusion node 118 and the pick-up well contact region 120. In further embodiments, the BSI structures 258 may be back-side deep trench isolation structures.

In some embodiments, an anti-reflection layer 260 is disposed on the back-side 104b of the semiconductor substrate 104. In some embodiments, the anti-reflection layer 260 contacts the pixel sensor well region 102 and the BSI structures 258. The anti-reflection layer 260 is configured to reduce the amount of incident radiation reflected by the semiconductor substrate 104. In some embodiments, the anti-reflection layer 260 comprises, for example, an oxide, a high-k dielectric, a nitride, or the like. In further embodiments, the anti-reflection layer 260 may comprise a first layer comprising an oxide stacked on a second layer comprising a high-k dielectric, or vice versa.

A plurality of color filters 262 (e.g., a red color filer, a blue color filter, a green color filer, etc.) are disposed on the anti-reflection layer 260. In some embodiments, the color filters 262 are arranged in an array over the anti-reflection layer 260. In such an embodiment, the color filters 262 are respectively disposed over the photodetectors 106a-d. The color filters 262 are respectively configured to transmit specific wavelengths of incident radiation. For example, a first color filter (e.g., the red color filter) may transmit light having wavelengths within a first range, while a second color filter (e.g., the blue color filter) may transmit light having wavelengths within a second range different than the first range. Further, a plurality of micro-lenses 264 are disposed on the color filters 262. In some embodiments, the micro-lenses 264 are respectively disposed over the color filters 262. The micro-lenses 264 are configured to focus incident radiation (e.g., photons) towards the photodetectors 106a-d.

Figure 3:
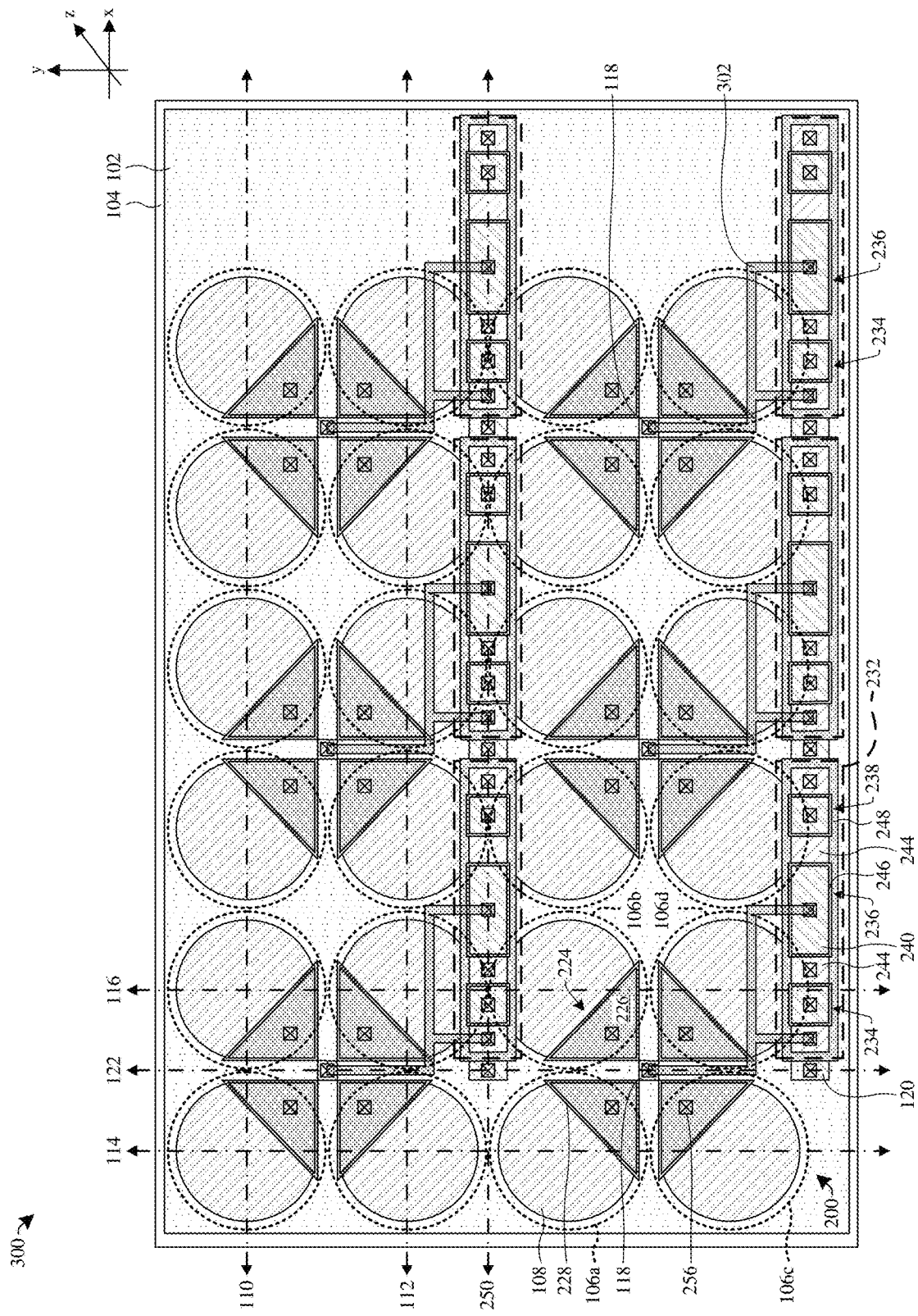
FIG. 3 illustrates some embodiments of an image sensor 300 having a plurality of integrated chips (ICs) each represented by the IC of FIGS. 2A-2C.

FIG. 3 illustrates some embodiments of an image sensor 300 having a plurality of integrated chips (ICs) each represented by the IC 200 of FIGS. 2A-2C.

As shown in FIG. 3, the ICs 200 are arranged in an array comprising a plurality of rows of ICs (e.g., along an x-axis) and a plurality of columns of ICs (e.g., along a y-axis). In some embodiments, the ICs 200 respectively comprise conductive lines 302. The conductive lines 302 electrically couple together the floating diffusion node 118 of each IC 200, one of the source/drain regions 244 of the reset transistor 234 of each IC 200, and the pixel device gate electrode 240 of the source follower transistor 236 of each IC 200.

In some embodiments, the conductive lines 302 are disposed in the interconnect structure 252 (e.g., as shown in the cross-sectional view of FIG. 2C). In such an embodiment, the conductive lines 302 may be disposed in an inter-metal dielectric (IMD) layer (not shown in FIG. 2C) disposed on the ILD layer 254 and the conductive contacts 256, so that the conductive lines 302 and the IMD layer are vertically separated from the front-side 104f of the semiconductor substrate 104 by the ILD layer 254. In some embodiments, the conductive lines 302 may comprise, for example, copper, aluminum, or the like. In further embodiments, the IMD layer may comprise, for example, a low-k dielectric layer, an ultra-low-k dielectric layer, an oxide, or the like. In yet further embodiments, the pixel device region 232 of some of the ICs 200 may extend along the first direction (e.g., along the x-axis) between a third photodetector 106c of a first IC 200 disposed in an adjacent column of ICs and between a first photodetector 106a of a second IC 200 disposed in the adjacent column of ICs, where the first IC 200 and the second IC 200 are arranged in adjacent rows of ICs.

FIG. 4A-4C through 10A-10C illustrate a series of various views of some embodiments of a method for forming the integrated chip (IC) of FIGS. 2A-2C. Figures with a suffix of "A" illustrate either a front-side facing view of the IC or a back-side facing view of the IC that correspond to an orientation of the IC during various formation processes. Figures with a suffix of "B" are taken along line A-A' of FIGS. with a suffix of "A." Figures with a suffix of "C" are taken along line B-B' of FIGS. with a suffix of "A."

Figure 4B:
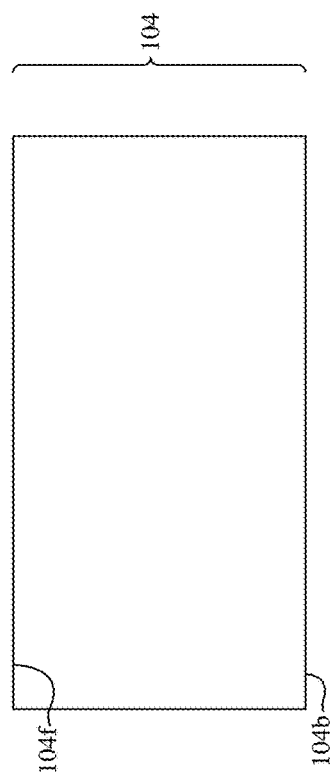
Figure 4C:
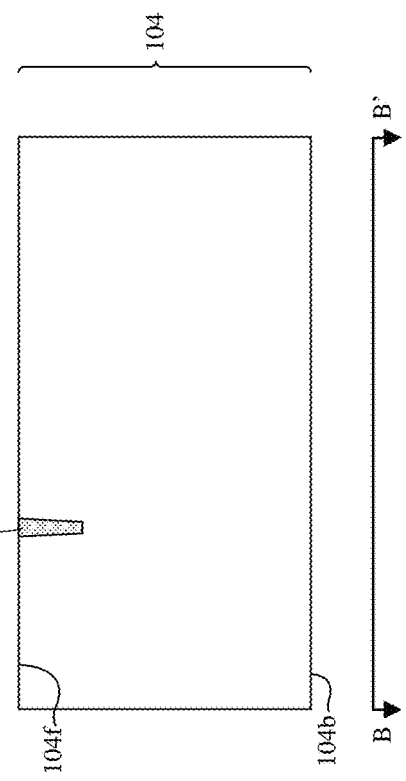
Figure 4A:
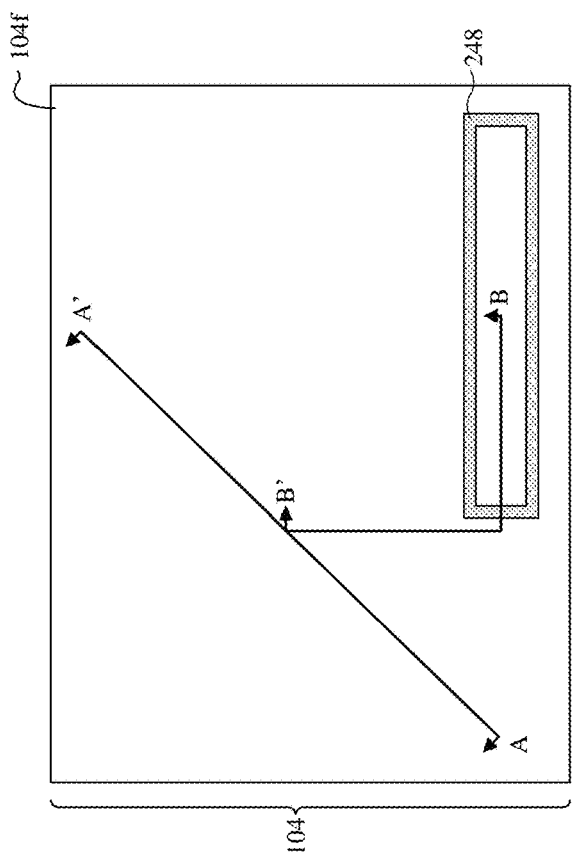

As shown in FIGS. 4A-4C, a pixel device region isolation structure 248 is formed in the semiconductor substrate 104. In some embodiments, the pixel device region isolation structure 248 may be formed by selectively etching the semiconductor substrate 104 to form a trench in the semiconductor substrate 104 that extends into the semiconductor substrate 104 from a front-side 104f of the semiconductor substrate 104, and subsequently filling (e.g., by chemical vapor deposition (CVD), physical vapor deposition (PVD), atomic layer deposition (ALD), thermal oxidation, sputtering, etc.) the trench with a dielectric material. In further embodiments, the semiconductor substrate 104 is selectively etched by forming a masking layer (not shown) on the front-side 104f of the semiconductor substrate 104, and subsequently exposing the semiconductor substrate 104 to an etchant configured to selectively remove unmasked portions of the semiconductor substrate 104. In yet further embodiments, the dielectric material may comprise an oxide (e.g., silicon oxide), a nitride, or the like. In other embodiments, the pixel device region isolation structure 248 may be an isolation well. In such an embodiment, the isolation well may be formed by a selective ion implantation process that utilizes a masking layer (not shown) on the front-side 104f of the semiconductor substrate 104 to selectively implant ions into the semiconductor substrate 104.

Figure 5B:
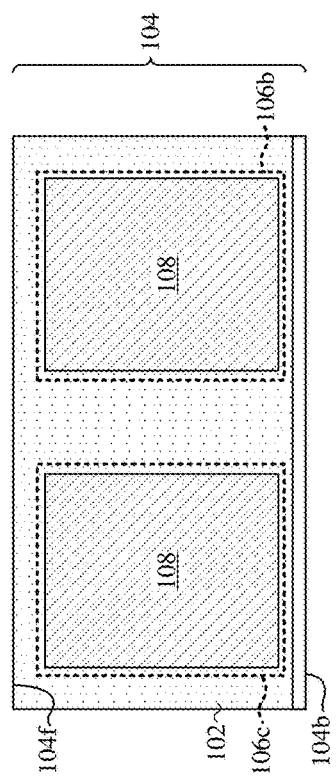
Figure 5C:
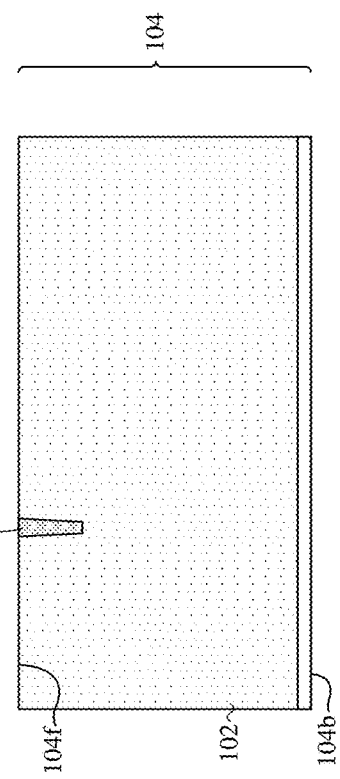
Figure 5A:
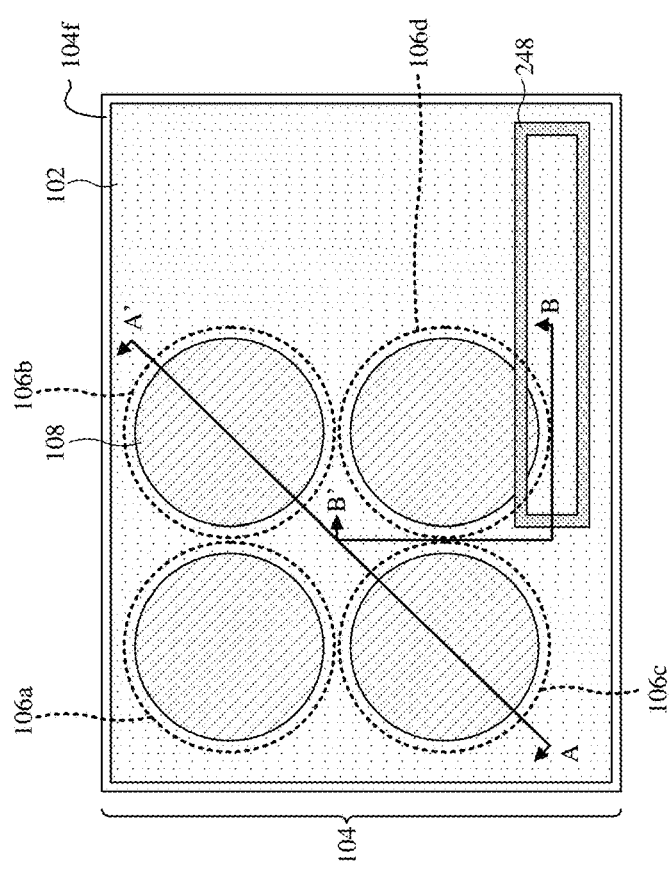

As shown in FIGS. 5A-5C, a pixel sensor well region 102 is formed in the semiconductor substrate 104. The pixel sensor well region 102 is a region of the semiconductor substrate 104 having a first doping type (e.g., p-type doping). In some embodiments, the pixel sensor well region 102 may be formed by a selective ion implantation process that utilizes a masking layer (not shown) on the front-side 104f of the semiconductor substrate 104 to selectively implant ions into the semiconductor substrate 104. In other embodiments, the pixel sensor well region 102 may be formed by a blanket ion implantation process (e.g., an unmasked ion implantation) to implant ions into the semiconductor substrate 104.

Also shown in FIGS. 5A-5C, a plurality of photodetectors 106a-d are formed in the semiconductor substrate 104. The photodetectors 106a-d each comprise a photodetector collector region 108 and portions of the pixel sensor well region 102 disposed around the photodetector collector region 108 in which a depletion region has formed (e.g., due to p-n junctions between the photodetector collector regions 108 and the pixel sensor well region 102). In some embodiments, the plurality of photodetectors 106a-d comprise a first photodetector 106a, a second photodetector 106b, a third photodetector 106c, and a fourth photodetector 106d.

In some embodiments, a process for forming the photodetectors 106a-d comprises forming a plurality of photodetector collector regions 108 in the pixel sensor well region 102. The photodetector collector regions 108 are discrete regions of the semiconductor substrate 104 having a second doping type (e.g., n-type doping) opposite the first doping type. In some embodiments, the photodetector collector regions 108 may be formed by a selective ion implantation process that utilizes a masking layer (not shown) on the front-side 104f of the semiconductor substrate 104 to selectively implant ions into the semiconductor substrate 104. Because the photodetector collector regions 108 and the pixel sensor well region 102 have opposite doping types, depletion regions (shown as a region surrounded by dotted lines) form in portions of the pixel sensor well region 102 disposed around each photodetector collector region 108.

Figure 6B:
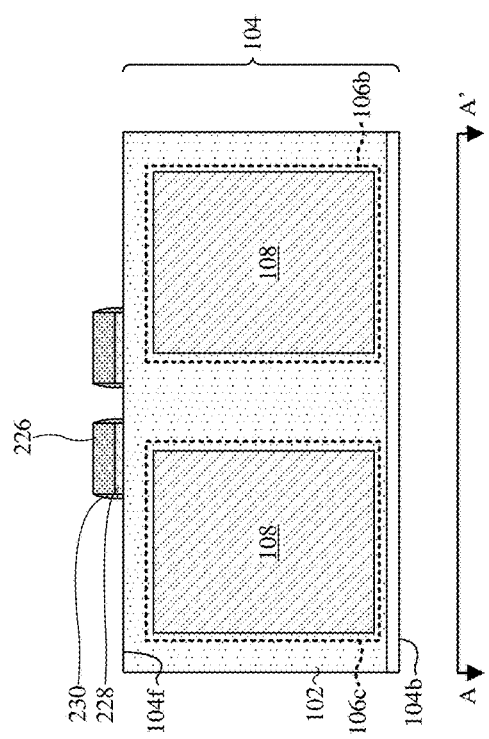
Figure 6C:
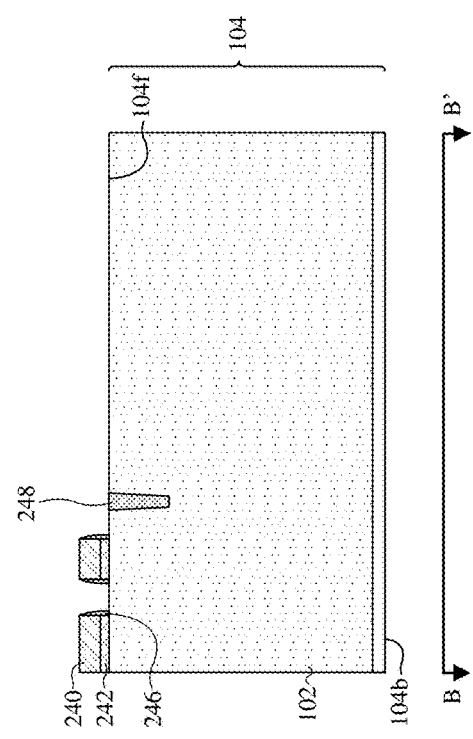
Figure 6A:
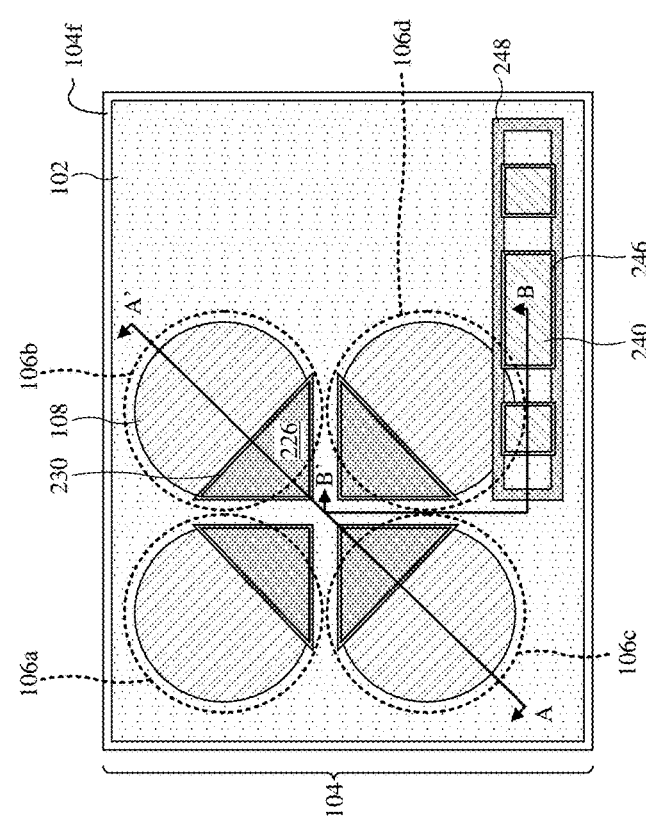

As shown in FIGS. 6A-6C, transfer transistor gate dielectrics 228 are formed on the front-side 104f of the semiconductor substrate 104, and transfer transistor gate electrodes 226 are respectively formed on the transfer transistor gate dielectrics 228. Further, pixel device gate dielectrics 242 are formed on the front-side 104f of the semiconductor substrate 104, and pixel device gate electrodes 240 are respectively formed on the pixel device gate dielectrics 242. In some embodiments, when viewing the front-side 104f of the semiconductor substrate 104, the transfer transistor gate dielectrics 228 and the transfer transistor gate electrodes 226 may be formed with a triangular layout.

In some embodiments, a process for forming the transfer transistor gate dielectrics 228, the pixel device gate dielectrics 242, the transfer transistor gate electrodes 226, and the pixel device gate electrodes 240 comprises depositing and/or growing (e.g., by CVD, PVD, ALD, thermal oxidation, sputtering, etc.) a gate dielectric layer on the front-side 104f of the semiconductor substrate 104. Next, a gate electrode layer may be deposited (e.g., by CVD, PVD, ALD, sputtering, electrochemical plating, electroless plating, etc.) on the gate dielectric layer. Subsequently, the gate dielectric layer and the gate electrode layer are patterned and etched to form the transfer transistor gate dielectrics 228, the pixel device gate dielectrics 242, the transfer transistor gate electrodes 226, and the pixel device gate electrodes 240. In further embodiments, the gate electrode layer may comprise, for example, polysilicon, aluminum, or the like. In yet further embodiments, the gate dielectric layer may comprise, for example, an oxide, a high-k dielectric, or the like.

Also shown in FIGS. 6A-6C, transfer transistor sidewall spacers 230 are formed on the front-side 104f of the semiconductor substrate 104 and along sidewalls of the transfer transistor gate electrodes 226 and sidewalls of the transfer transistor gate dielectrics 228. Further, pixel device sidewall spacers 246 are formed on the front-side 104f of the semiconductor substrate 104 and along sidewalls of the pixel device gate electrodes 240 and sidewalls of the pixel device gate dielectrics 242.

In some embodiments, the transfer transistor sidewall spacers 230 and the pixel device sidewall spacers 246 may be formed by depositing (e.g., by CVD, PVD, ALD, sputtering, etc.) a spacer layer over the front-side 104f of the semiconductor substrate 104, the transfer transistor gate dielectrics 228, the pixel device gate dielectrics 242, the transfer transistor gate electrodes 226, and the pixel device gate electrodes 240. In further embodiments, the spacer layer is subsequently etched to remove the spacer layer from horizontal surfaces, thereby forming the transfer transistor sidewall spacers 230 along sidewalls of the transfer transistor gate electrodes 226 and sidewalls of the transfer transistor gate dielectrics 228 and forming the pixel device sidewall spacers 246 along sidewalls of the pixel device gate electrodes 240 and sidewalls of the pixel device gate dielectrics 242. In further embodiments, the spacer layer may comprise a nitride, an oxide, or some other dielectric. In yet further embodiments, before the transfer transistor sidewall spacers 230 and the pixel device sidewall spacers 246 are formed, lightly-doped source/drain extensions (not shown) may be formed in the semiconductor substrate 104 on opposing sides of the pixel device gate electrodes 240. In such an embodiment, the lightly-doped source/drain extensions (not shown) may be formed by a selective ion implantation process that utilizes a masking layer (not shown) on the front-side 104f of the semiconductor substrate 104 to selectively implant ions into the semiconductor substrate 104.

As shown in FIGS. 7A-7C, source/drain regions 244 are formed in the semiconductor substrate 104 on opposing sides of the pixel device gate electrodes 240. In some embodiments, the source/drain regions 244 are regions of the semiconductor substrate 104 having the second doping type (e.g., n-type doping). In further embodiments, sides of some of the source/drain regions 244 are substantially aligned with opposing outer sidewalls of the pixel device sidewall spacers 246. In yet further embodiments, the source/drain regions 244 may contact respective lightly-doped source/drain extensions (not shown). In such an embodiment, the lightly-doped source/drain extensions may have a lower concentration of the second doping type than the source/drain regions. In further such embodiments, the sides of the lightly-doped source/drain extensions facing the pixel device gate electrodes 240 may align with sidewalls of the pixel device gate electrodes 240 and/or the pixel device gate dielectrics 242. In some embodiments, the source/drain regions 244 may be formed by a first selective ion implantation process that utilizes a masking layer (not shown) disposed on the front-side 104f of the semiconductor substrate 104 to selectively implant n-type dopants (e.g., phosphorus) into the semiconductor substrate 104.

In some embodiments, a reset transistor 234, a source follower transistor 236, and a row-select transistor 238 each comprise a pixel device gate electrode 240 stacked on a pixel device gate dielectric 242. Further, the reset transistor 234, the source follower transistor 236, and the row-select transistor 238 each comprise source/drain regions 244 respectively disposed on opposite sides of the pixel device gate electrode 240 and the pixel device gate dielectric 242 stacks. In further embodiments, the reset transistor 234, the source follower transistor 236, and the row-select transistor 238 may be disposed in a pixel device region 232. In such an embodiment, outer sides of the pixel device region isolation structure 248 may define outer sides of the pixel device region 232.

Also shown in FIG. 7A-7C, a pick-up well contact region 120 is formed in the pixel sensor well region 102. The pick-up well contact region 120 is a region of the semiconductor substrate 104 having the first doping type (e.g., p-type doping). In some embodiments, the pick-up well contact region 120 has a higher concentration of the first doping type than the pixel sensor well region 102. In some embodiments, the pick-up well contact region 120 is formed outside the pixel device region 232. In further embodiments, the pick-up well contact region 120 may be formed contacting the pixel device region isolation structure 248. In yet further embodiments, the pick-up well contact region 120 is formed in a first substantially straight line with the pixel device region 232, such that the first substantially straight line axis that extends in a first direction intersects a center point of the pick-up well contact region 120, center points of the source/drain regions 244, center points of the pixel device gate electrodes 240, and center points of the pixel device gate dielectrics 242.

In some embodiments, the pick-up well contact region 120 may be formed by a second selective ion implantation process that utilizes a masking layer (not shown) on the front-side 104f of the semiconductor substrate 104 to selectively implant p-type dopants (e.g., boron) into the semiconductor substrate 104. In further embodiments, the second selective ion implantation process may be performed before the first selective ion implantation process. In other embodiments, the first selective ion implantation process may be performed before the second selective ion implantation process.

Also shown in FIG. 7A-7C, a floating diffusion node 118 is formed in the pixel sensor well region 102 between the photodetectors 106a-d. The floating diffusion node 118 is a region of the semiconductor substrate having the second doping type (e.g., n-type doping). In some embodiments, the floating diffusion node 118 is formed in a second substantially straight line with the pick-up well contact region 120, such that the second substantially straight line axis that extends in a second direction substantially perpendicular to the first direction intersects a center point of the pick-up well contact region 120 and a center point of the floating diffusion node 118. In further embodiments, the second substantially straight line axis may be substantially perpendicular to a third substantially straight line axis that intersects a center point of the first photodetector 106a and a center point of the second photodetector 106b. In yet further embodiments, the second substantially straight line axis may be substantially perpendicular to a fourth substantially straight line axis that intersects a center point of the third photodetector 106c and a center point of the fourth photodetector 106d.

In some embodiments, the floating diffusion node 118 may be formed by the first ion implantation process. In such an embodiment, the floating diffusion node 118 and the source/drain regions 244 may have about the same concentration of the second doping type. In other embodiments, the floating diffusion node 118 may be formed by a third selective ion implantation process that utilizes a masking layer (not shown) on the front-side 104f of the semiconductor substrate 104 to selectively implant n-type dopants (e.g., phosphorus) into the semiconductor substrate 104. In such an embodiment, the third selective ion implantation process may be performed before the first selective ion implantation process, or vice versa, or before the second selective ion implantation process, or vice versa. In further embodiments, an anneal process (e.g., laser anneal, rapid thermal anneal (RTA), etc.) is performed, after the source/drain regions 244, the pick-up well contact region 120, and the floating diffusion node 118 are formed, to activate the dopants.

Figure 8B:
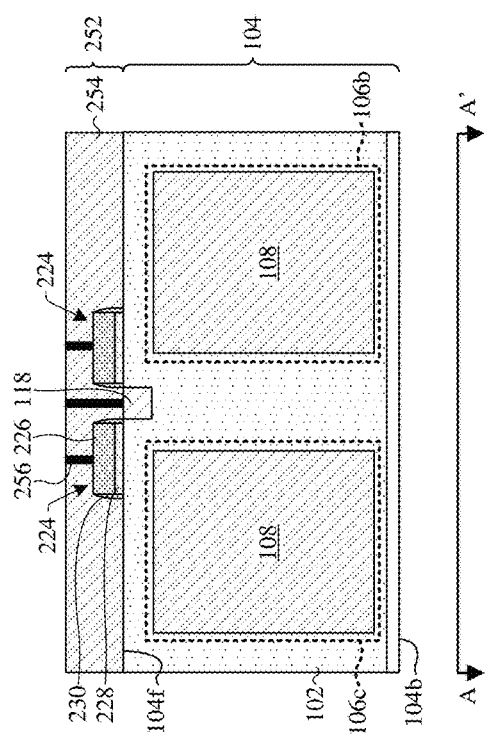
Figure 8C:
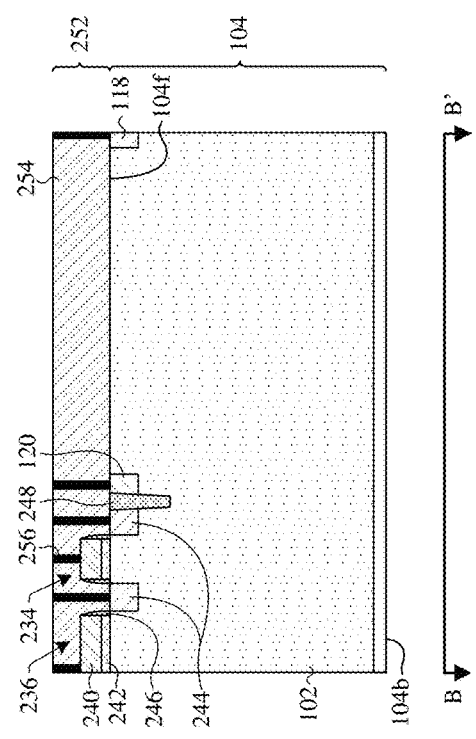
Figure 8A:
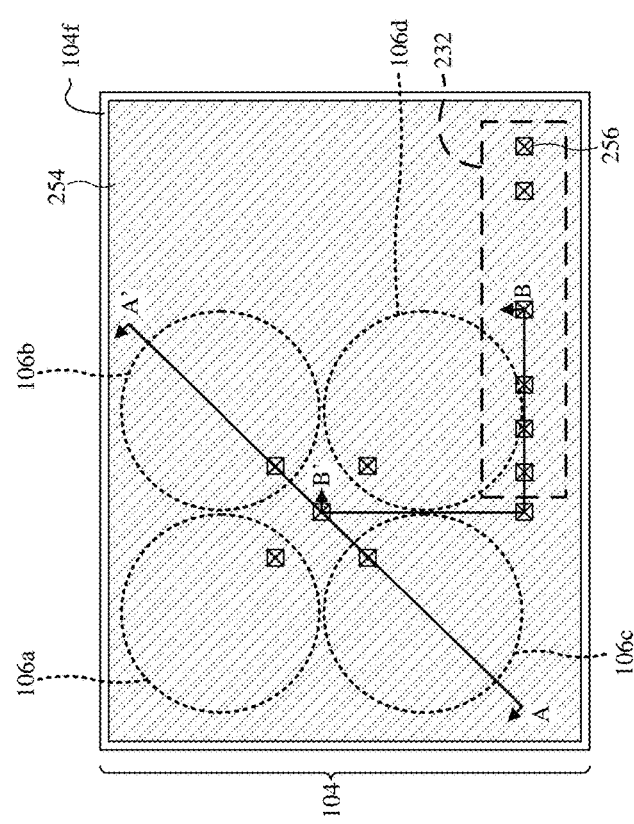

As shown in FIGS. 8A-8C, an interlayer dielectric (ILD) layer 254 is formed on the front-side 104f of the semiconductor substrate 104. In some embodiments, the ILD layer 254 is formed on the pixel sensor well region 102, the source/drain regions 244, the pixel device region isolation structure 248, the pick-up well contact region 120, the floating diffusion node 118, the pixel device gate electrodes 240, the transfer transistor gate electrodes 226, the pixel device sidewall spacers 246, and the transfer transistor sidewall spacers 230. The ILD layer 254 may be formed with a substantially planar upper surface and may comprise an oxide, a nitride, a low-k dielectric, or the like. In some embodiments, the ILD layer 254 may be formed by CVD, PVD, ALD, sputtering, or the like. In further embodiments, a planarization process (e.g., a chemical-mechanical planarization (CMP)) may be performed on the ILD layer 254 to form the substantially planar upper surface.

Also shown in FIGS. 8A-8C, a plurality of conductive contacts 256 are formed in the ILD layer 254 that respectively extend through the ILD layer 254 to the transfer transistor gate electrodes 226, the floating diffusion node 118, the pick-up well contact region 120, the source/drain regions 244, and the pixel device gate electrodes 240. In some embodiments, a conductive contact 256 may not be formed in the ILD layer 254 that extends through the ILD layer 254 to the source/drain region 244 disposed between the pixel device gate electrode 240 of the source follower transistor 236 and the pixel device gate electrode 240 of the row-select transistor 238. In further embodiments, a process for forming the conductive contacts 256 comprises performing an etch into the ILD layer 254 to form contact openings that correspond to the conductive contacts 256. In further embodiments, the etch may be performed with a patterned masking layer formed over the ILD layer 254. In yet further embodiments, the contact openings may be filled by depositing or growing a conductive material (e.g., tungsten) covering the ILD layer 254 that fills the contact openings, and subsequently performing a planarization process (e.g., CMP) on the conductive contacts 256 and ILD layer 254.

Figure 9B:
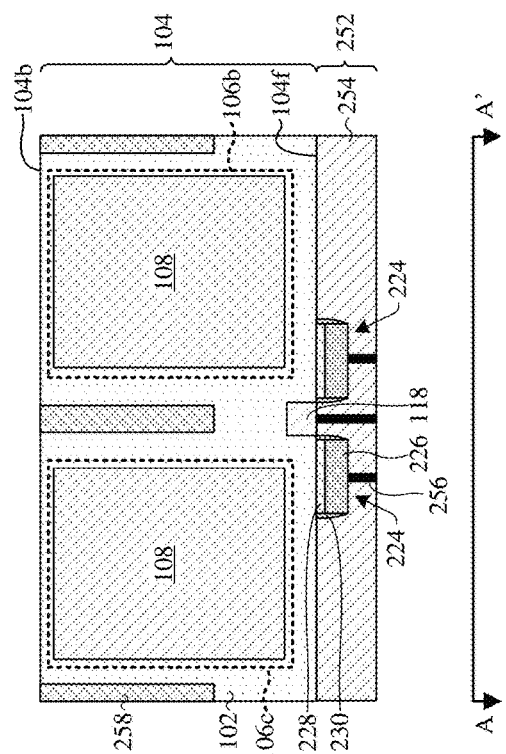
Figure 9C:
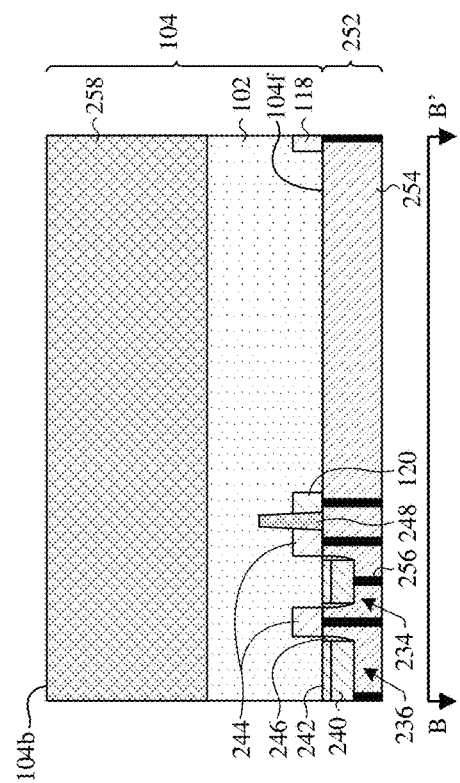
Figure 9A:
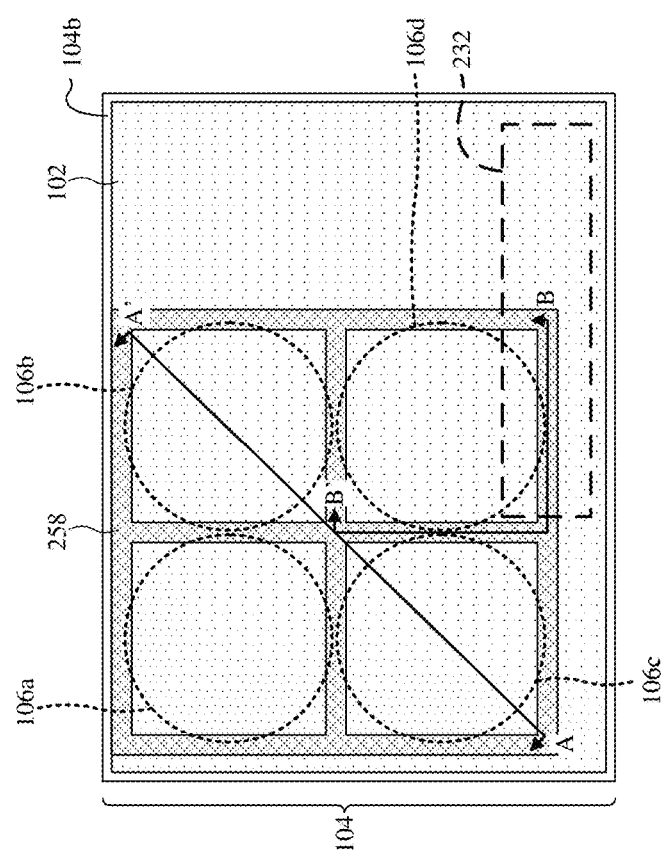

As shown in FIGS. 9A-9C, in some embodiments, the semiconductor substrate 104 is thinned, such that the semiconductor substrate 104 has a reduced thickness. In further embodiments, the thinning may expose the pixel sensor well region 102 on the back-side 104b of the semiconductor substrate 104. The thinning may be, for example, performed by a planarization process, an etch back process, or the like. In further embodiments, the planarization process may be a CMP process.

Also shown in FIGS. 9A-9C, a plurality of back-side isolation (BSI) structures 258 are formed in the semiconductor substrate 104. The BSI structures 258 extend into the semiconductor substrate 104 from a back-side 104b of the semiconductor substrate 104 opposite the front-side 104f. In some embodiments, the BSI structures 258 are formed in the semiconductor substrate 104 around sides of each of the photodetector collector regions 108.

In some embodiments, a process for forming the BSI structures 258 comprises selectively etching the semiconductor substrate 104 to form trenches in the semiconductor substrate 104 that extend into the semiconductor substrate 104 from the back-side 104b of the semiconductor substrate 104, and subsequently filling the trenches (e.g., by CVD, PVD, ALD, thermal oxidation, sputtering, etc.) with a dielectric material. In further embodiments, the semiconductor substrate 104 is selectively etched by forming a masking layer (not shown) on the back-side 104b of the semiconductor substrate 104, and subsequently exposing the semiconductor substrate 104 to an etchant configured to selectively remove unmasked portions of the semiconductor substrate 104. In further embodiments, the dielectric material may comprise an oxide, a nitride, or the like. In yet further embodiments, a planarization process (e.g., CMP) may be performed on the dielectric layer and the back-side 104b of the semiconductor substrate 104 to form a substantially planar surface.

As shown in FIGS. 10A-10C, an anti-reflection layer 260 is formed on the back-side 104b of the semiconductor substrate 104. In some embodiments, the anti-reflection layer 260 is formed on the pixel sensor well region 102 and the BSI structures 258. The anti-reflection layer 260 is configured to reduce the amount of incident radiation reflected by the semiconductor substrate 104. In some embodiments, the anti-reflection layer 260 may be formed by CVD, PVD, ALD, sputtering, or the like. In further embodiments, the anti-reflection layer 260 may be planarized (e.g., via CMP) subsequent to formation.

Also shown in FIGS. 10A-10C, a plurality of color filters 262 (e.g., a red color filer, a blue color filter, a green color filer, etc.) are formed on the anti-reflection layer 260. In some embodiments, center points of the plurality of color filters 262 are substantially aligned in a vertical direction with center points of the photodetector collector regions 108, respectively. In further embodiments, the plurality of color filters 262 may be formed by forming various color filter layers and patterning the color filter layers. The color filter layers are formed of material that allows for the transmission of radiation (e.g., light) having a specific wavelength range, while blocking light of wavelengths outside of the specified range. Further, in some embodiments, the color filter layers may be planarized (e.g., via CMP) subsequent to formation.

A plurality of micro-lenses 264 are formed over the plurality of color filters 262. In some embodiments, center points of the micro-lenses 264 are substantially aligned in a vertical direction with center points of the color filters 262, respectively. In further embodiments, the micro-lenses 264 may be formed by depositing a micro-lens material on the color filters 262 (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The micro-lenses 264 are then formed by selectively etching the micro-lens material according to the micro-lens template.

Figure 11:
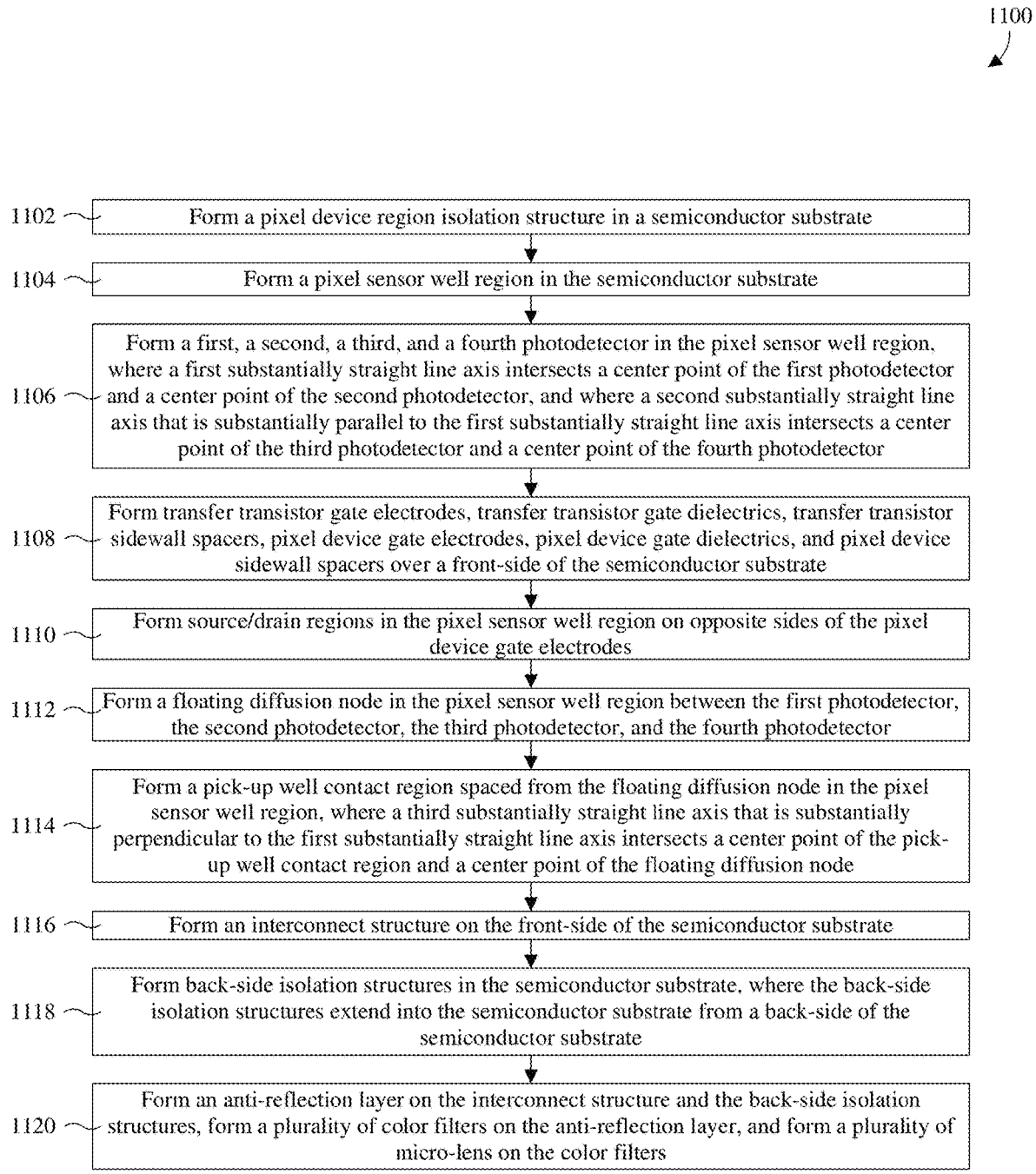
FIG. 11 illustrates a flowchart of some embodiments of a method for forming the integrated chip (IC) of FIGS. 2A-2C.

As illustrated in FIG. 11, a flowchart 1100 of some embodiments of a method for forming the integrated chip (IC) of FIGS. 2A-2C is provided. While the flowchart 1100 of FIG. 11 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1102, a pixel device region isolation structure is formed in a semiconductor substrate. FIGS. 4A-4C illustrate various views of some embodiments corresponding to act 1102.

At 1104, a pixel sensor well region is formed in the semiconductor substrate. FIGS. 5A-5C illustrate various views of some embodiments corresponding to act 1104.

At 1106, a first, a second, a third, and a fourth photodetector are formed in the pixel sensor well region, where a first substantially straight line axis intersects a center point of the first photodetector and a center point of the second photodetector, and where a second substantially straight line axis that is substantially parallel to the first substantially straight line axis intersects a center point of the third photodetector and a center point of the fourth photodetector. FIGS. 5A-5C illustrate various views of some embodiments corresponding to act 1106.

At 1108, transfer transistor gate electrodes, transfer transistor gate dielectrics, transfer transistor sidewall spacers, pixel device gate electrodes, pixel device gate dielectrics, and pixel device sidewall spacers are formed over a front-side of the semiconductor substrate. FIGS. 6A-6C illustrate various views of some embodiments corresponding to act 1108.

At 1110, source/drain regions are formed in the pixel sensor well region on opposite sides of the pixel device gate electrodes. FIGS. 7A-7C illustrate various views of some embodiments corresponding to act 1110.

At 1112, a floating diffusion node is formed in the pixel sensor well region between the first photodetector, the second photodetector, the third photodetector, and the fourth photodetector. FIGS. 7A-7C illustrate various views of some embodiments corresponding to act 1112.

At 1114, a pick-up well contact region is formed spaced from the floating diffusion node in the pixel sensor well region, where a third substantially straight line axis that is substantially perpendicular to the first substantially straight line axis intersects a center point of the pick-up well contact region and a center point of the floating diffusion node. FIGS. 7A-7C illustrate various views of some embodiments corresponding to act 1114.

At 1116, an interconnect structure is formed on the front-side of the semiconductor substrate. FIGS. 8A-8C illustrate various views of some embodiments corresponding to act 1116.

At 1118, back-side isolation structures are formed in the semiconductor substrate, where the back-side isolation structures extend into the semiconductor substrate from a back-side of the semiconductor substrate. FIGS. 9A-9C illustrate various views of some embodiments corresponding to act 1118.

At 1120, an anti-reflection layer is formed on the interconnect structure and the back-side isolation structures, a plurality of color filters are formed on the anti-reflection layer, and a plurality of micro-lens are formed on the color filters. FIGS. 10A-10C illustrate various views of some embodiments corresponding to act 1120.

In some embodiments, the present application provides a pixel sensor. The pixel sensor includes a first photodetector disposed in a semiconductor substrate. A second photodetector is disposed in the semiconductor substrate, where a first substantially straight line axis intersects a center point of the first photodetector and a center point of the second photodetector. A floating diffusion node is disposed in the semiconductor substrate at a point that is a substantially equal distance from the first photodetector and the second photodetector. A pick-up well contact region is disposed in the semiconductor substrate, where a second substantially straight line axis that is substantially perpendicular to the first substantially straight line axis intersects a center point of the floating diffusion node and a center point of the pick-up well contact region.

In other embodiments, the present application provides an image sensor. The image sensor includes a first floating diffusion node disposed in a first pixel sensor well region that is disposed in the semiconductor substrate. A plurality of first photodetectors are disposed in the first pixel sensor well region, where the plurality of first photodetectors includes a first photodetector and a second photodetector separated from the first floating diffusion node by substantially equal distances. A second floating diffusion node is disposed in a second pixel sensor well region that is disposed in the semiconductor substrate. A plurality of second photodetectors is disposed in the second pixel sensor well region, where the plurality of second photodetectors includes a third photodetector and a fourth photodetector separated from the second floating diffusion node by substantially equal distances. A first pick-up well contact region is disposed in the semiconductor substrate between the plurality of first photodetectors and the plurality of second photodetectors, where a first line intersects the first floating diffusion node, the second floating diffusion node, and the first pick-up well contact region.

In yet other embodiments, the present application provides a method for forming a pixel sensor. The method includes forming a first doped well region having a first doping type in a semiconductor substrate. A first photodetector collector region having a second doping type different than the first doping type is formed in the semiconductor substrate. A second photodetector collector region having the second doping type is formed in the semiconductor substrate and spaced from the first photodetector collector region, where a first line intersects the first photodetector collector region and the second photodetector collector region. A floating diffusion node is formed in the semiconductor substrate between the first photodetector collector region and the second photodetector collector region. A pick-up well contact region having the first doping type is formed in the first doped well region, where the pick-up well contact region has a higher concentration of the first doping type than the first doped well region, and where a second line that is substantially perpendicular to the first line intersects the floating diffusion node and the pick-up well contact region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a first pixel sensor comprising a first floating diffusion node and at least one photodetector, wherein the first floating diffusion node is disposed in a substrate;
a second pixel sensor comprising a second floating diffusion node and at least one photodetector, wherein the second floating diffusion node is disposed in the substrate and spaced from the first floating diffusion node, wherein the first and second floating diffusion nodes are disposed in a first row that extends laterally in a first direction;
a first pixel device region comprising a first image processing device;
a second pixel device region comprising a second image processing device; and
a pick-up well contact region disposed in the substrate, wherein the pick-up well contact region is disposed laterally between the first pixel device region and the second pixel device region, and wherein the pick-up well contact region, the first pixel device region, and the second pixel device region are disposed in a second row that extends laterally in the first direction, wherein the second row neighbors the first row, wherein the pick-up well contact region and the first floating diffusion node are disposed in a first column that extends laterally in a second direction that is substantially perpendicular to the first direction, and wherein the second floating diffusion node is laterally spaced in the first direction from both the pick-up well contact region and the first floating diffusion node.

2. The image sensor of claim 1, wherein the first row extends in parallel with the second row.

3. The image sensor of claim 1, wherein:
the first floating diffusion node is spaced from the pick-up well contact region in the second direction by a first distance; and
the first floating diffusion node is spaced from the second floating diffusion node in the first direction by a second distance that is greater than the first distance.

4. The image sensor of claim 1, wherein:
the first image processing device is electrically coupled to the first floating diffusion node; and
the second image processing device is electrically coupled to the second floating diffusion node.

5. The image sensor of claim 1, wherein:
the first pixel device region comprises a first isolation structure disposed in the substrate and laterally surrounding the first image processing device;
the second pixel device region comprises a second isolation structure disposed in the substrate and laterally surrounding the second image processing device; and
the pick-up well contact region is disposed laterally between the first isolation structure and the second isolation structure.

6. The image sensor of claim 5, wherein:
the first isolation structure extends laterally in the first direction a first distance;
the first isolation structure extends laterally in the second direction a second distance less than the first distance;
the second isolation structure extends laterally in the first direction a third distance; and
the second isolation structure extends laterally in the second direction a fourth distance less than the third distance.

7. An image sensor, comprising:
a first pixel sensor comprising a first floating diffusion node and at least one photodetector, wherein the first floating diffusion node is disposed in a substrate;
a second pixel sensor comprising a second floating diffusion node and at least one photodetector, wherein the second floating diffusion node is disposed in the substrate and spaced from the first floating diffusion node;
a pick-up well contact region disposed in the substrate, wherein the pick-up well contact region is disposed laterally between the first floating diffusion node and the second floating diffusion node, and wherein the first floating diffusion node, the second floating diffusion node, and the pick-up well contact region are disposed in a column that extends laterally in a first direction; and
a pixel device region comprising an image processing device, wherein the pixel device region and the pick-up well contact region are disposed in a row that extends laterally in a second direction perpendicular to the first direction.

8. The image sensor of claim 7, wherein the pick-up well contact region is spaced from the first floating diffusion node and the second floating diffusion node by a substantially equal distance.

9. The image sensor of claim 7, wherein a layout of the second pixel sensor is substantially the same as a layout of the first pixel sensor.

10. An image sensor, comprising:
a plurality of pixel sensors, wherein the pixel sensors comprise floating diffusion nodes, respectively, wherein the floating diffusion nodes are disposed in a substrate, and wherein the floating diffusion nodes are disposed in a first array comprising a first set of rows that extend in a first direction and a first set of columns that extend in a second direction perpendicular to the first direction;
a plurality of pick-up well contact regions disposed in the substrate, wherein:
the pick-up well contact regions are disposed in a second array comprising a second set of rows that extend in the first direction and a second set of columns that extend in the second direction;
the first array and the second array are aligned in the first direction, such that the first set of columns are aligned with the second set of columns, respectively, in the first direction;
the second array is shifted in the second direction in relation to the first array, such that the first set of rows and the second set of rows alternate back and forth in the second direction; and
a plurality of pixel device regions, wherein each of the pixel device regions comprise at least one image processing device, wherein the plurality of pixel device regions are disposed in a third set of rows, and wherein the third set of rows are aligned with the second set of rows, respectively, in the second direction.

11. The image sensor of claim 10, wherein each row of the first set of rows is spaced in the second direction from its neighboring row of the first set of rows by substantially the same distance.

12. The image sensor of claim 11, wherein each row of the second set of rows is spaced in the second direction from its neighboring row of the second set of rows by substantially the same distance.

13. The image sensor of claim 10, wherein each column of the first set of columns is spaced in the first direction from its neighboring column of the first set of columns by substantially the same distance.

14. The image sensor of claim 13, wherein each column of the second set of columns is spaced in the first direction from its neighboring column of the second set of columns by substantially the same distance.

15. The image sensor of claim 10, wherein the first set of rows and the second set of rows extend in parallel with one another.

16. The image sensor of claim 15, wherein the first set of columns and the second set of columns extend in parallel with one another.

17. The image sensor of claim 10, wherein:
- each of the floating diffusion nodes is spaced from its neighboring floating diffusion node in the first direction by a first distance;
- each of the floating diffusion nodes is spaced from its neighboring floating diffusion node in the second direction by a second distance;
- each of the pick-up well contact regions is spaced from its neighboring pick-up well contact region in the first direction by a third distance; and
- each of the pick-up well contact regions is spaced from its neighboring pick-up well contact region in the second direction by a fourth distance.

18. The image sensor of claim 10, wherein each of the plurality of pixel sensors have substantially the same layout.

19. The image sensor of claim 18, wherein each of the plurality of pixel sensors comprise a plurality of photodetectors disposed in the substrate.

20. The image sensor of claim 1, wherein:
- the first pixel sensor comprises a first transfer transistor gate and a second transfer transistor gate;
- the first transfer transistor gate and the second transfer transistor gate are both disposed laterally in the second direction between a center point of the first floating diffusion node and a center point of the pick-up well contact region;
- the first floating diffusion node and the pick-up well contact region are both disposed along an axis;
- the axis extends laterally in the second direction between a first sidewall of the first transfer transistor gate and a second sidewall of the second transfer transistor gate; and
- the first sidewall faces the second sidewall.

* * * * *